United States Patent
Kinugawa et al.

(10) Patent No.: US 9,975,705 B2
(45) Date of Patent: May 22, 2018

(54) ARTICLE TRANSPORT FACILITY

(71) Applicant: Daifuku Co., Ltd., Osaka-shi (JP)

(72) Inventors: Tomotaka Kinugawa, Yasu (JP); Yasushi Morikawa, Gamo-gun (JP)

(73) Assignee: Daifuku Co., Ltd., Osaka-shi (JP)

( * ) Notice: Subject to any disclaimer, the term of this patent is extended or adjusted under 35 U.S.C. 154(b) by 2 days.

(21) Appl. No.: 15/359,889

(22) Filed: Nov. 23, 2016

(65) Prior Publication Data

US 2017/0152111 A1    Jun. 1, 2017

(30) Foreign Application Priority Data

Nov. 26, 2015  (JP) ................... 2015-230938

(51) Int. Cl.

| | | |
|---|---|---|
| *H01L 21/677* | (2006.01) | |
| *B65G 43/00* | (2006.01) | |
| *B65G 35/06* | (2006.01) | |
| *B66C 19/00* | (2006.01) | |
| *B66C 13/08* | (2006.01) | |

(52) U.S. Cl.
CPC ............ *B65G 43/00* (2013.01); *B65G 35/06* (2013.01); *B66C 13/085* (2013.01); *B66C 19/00* (2013.01); *H01L 21/6773* (2013.01); *H01L 21/67712* (2013.01); *H01L 21/67727* (2013.01); *H01L 21/67733* (2013.01); *H01L 21/67772* (2013.01); *B65G 2201/0297* (2013.01)

(58) Field of Classification Search
CPC ................................. H01L 21/67733
USPC ..................................................... 294/67.5
See application file for complete search history.

(56) References Cited

U.S. PATENT DOCUMENTS

| | | | | |
|---|---|---|---|---|
| 4,883,184 A | * | 11/1989 | Albus ................. | B66C 13/06 212/195 |
| 8,701,864 B2 | | 4/2014 | Ogawa et al. | |
| 9,048,275 B2 | * | 6/2015 | Murata ............. | H01L 21/67733 |
| 9,117,853 B2 | * | 8/2015 | Tsubaki ............ | H01L 21/67733 |
| 2005/0079041 A1 | * | 4/2005 | Campbell ......... | H01L 21/67733 414/626 |
| 2013/0313070 A1 | | 11/2013 | Ogawa et al. | |

FOREIGN PATENT DOCUMENTS

JP        2013110370 A        6/2013

* cited by examiner

*Primary Examiner* — Gerald McClain
(74) *Attorney, Agent, or Firm* — The Webb Law Firm

(57) ABSTRACT

An article transport facility in which the attitude of its support mechanism can be easily corrected to an appropriate attitude. The facility includes an angle sensor configured to detect an angle of a first reference surface of an article supported by a vertically movable member with respect to the horizontal plane, one or more winding mechanisms, one or more second actuators configured to actuate the one or more winding mechanisms, and a controller. Each winding mechanism is configured to selectively take up and feed out a target elongate flexible member. The controller controls one or more second actuators to adjust the angle of the first reference surface to a preset angle with respect to the horizontal plane based on the detected information from the angle sensor.

6 Claims, 10 Drawing Sheets

ARTICLE TRANSPORT FACILITY

CROSS-REFERENCE TO RELATED APPLICATION

This application claims priority to Japanese Patent Application No. 2015-230938 filed Nov. 26, 2015, the disclosure of which is hereby incorporated in its entirety by reference.

FIELD OF THE INVENTION

The present invention relates to an article transport facility in which a vertically movable member configured to support an article is vertically moved with respect to a base portion.

BACKGROUND

An article transport facility is described in JP Publication of Application No. 2013-110370 which includes a base portion, a vertically movable member for supporting an article, a plurality of elongate flexible members for suspending the vertically movable member, and an actuator for selectively spooling and feeding out the elongate flexible members to lift and lower the vertically movable member with respect to the base member. In such an article transport facility, the elongate flexible members tend to stretch due to, among other causes, deterioration that occurs with the passage of time. And since each of elongate flexible members stretches by a different amount, the vertically movable member suspended by the plurality of elongate flexible members and the article supported by the vertically movable member may become tilted. To solve this problem, in this article transport facility, height adjusting mechanisms are fixed to an upper portion of the vertically movable member and the elongate flexible members are connected to the height adjusting mechanisms. In other words, in this article transport facility, the elongate flexible members are connected to the vertically movable member through the height adjusting mechanisms. A worker measures the tilt angle of the vertically movable member using an angle sensor, and operates the height adjusting mechanisms to adjust the tilting of the vertically movable member if the vertically movable member is tilted with respect to a preset angle.

The adjustment of the angle is done by a worker by operating the height adjusting mechanisms for the plurality of elongate flexible members based on the angle detected using the angle sensor such that the portions of the vertically movable member supported by the elongate flexible members are at the same height. Therefore, it may take a long time for a work to adjust the angle of the vertically movable member to a proper angle depending on the worker's skill level, etc.

SUMMARY OF THE INVENTION

In view of the background described above, an article transport facility is desired in which it is easy to adjust the angle of a vertically movable member to a proper angle.

In one embodiment, the article transport facility comprises: a base portion; a vertically movable member configured to support an article; a plurality of elongate flexible members connected to the vertically movable member to suspend the vertically movable member; a first actuator configured to selectively spool and feed out the plurality of elongate flexible members to vertically move the vertically movable member with respect to the base portion; an angle sensor configured to detect one of an angle of a first reference surface of the article supported by the vertically movable member with respect to a horizontal plane and an angle of a second reference surface of the vertically movable member with respect to a horizontal plane; one or more height adjusting mechanisms; one or more second actuators configured to actuate the one or more height adjusting mechanisms; and a controller; wherein, with one or more of the plurality of elongate flexible members that excludes one of the plurality of elongate flexible members being specified as one or more target elongate flexible members, each of the one or more height adjusting mechanisms is one of (a) a winding mechanism configured to selectively take up and feed out a corresponding one of the one or more target elongate flexible members, and (b) a position changing mechanism configured to change a relative positional relation, along a vertical direction, between a corresponding target elongate flexible member and the vertically movable member or the base portion; and wherein the controller performs an adjustment control for controlling the one or more second actuators based on detected information from the angle sensor to adjust the one of an angle of the first reference surface with respect to a horizontal plane and an angle of the second reference surface with respect to a horizontal plane, to a preset angle.

With this arrangement, by installing the angle sensor on, for example, the first reference surface of the article, the angle of the first reference surface with respect to the horizontal plane can be detected by the angle sensor. Alternatively, by installing the angle sensor on, for example, the second reference surface of the article, the angle of the first reference surface with respect to the horizontal plane can be detected by the angle sensor.

And when the angle sensor detects the angle of the first reference surface with respect to the horizontal plane and each of the one or more height adjusting mechanisms is a winding mechanism, then the one or more winding mechanisms are operated by the actuating action of the one or more second actuators when the controller performs the adjustment control so that the one or more target elongate flexible members (elongate flexible members to be adjusted) are selectively taken up or fed out. This allows the angle of the first reference surface with respect to the horizontal plane to be adjusted to a preset angle and the attitude of the vertically movable member to be corrected, so that the tilting of the article supported by the vertically movable member is alleviated.

And, when the angle sensor detects the angle of the first reference surface with respect to the horizontal plane and each of the one or more height adjusting mechanisms is a position changing mechanism, then, the one or more position changing mechanisms are operated by the actuating action of the one or more second actuators when the controller performs the adjustment control so that the relative positional relation between a target elongate flexible member and the vertically movable member or the base portion along the vertical direction is changed and so that the angle of the first reference surface with respect to the horizontal plane is adjusted to a preset angle. This allows the attitude of the vertically movable member to be corrected so that the tilting of the article supported by the vertically movable member can be alleviated.

Similarly, when the angle sensor detects the angle of the second reference surface with respect to the horizontal plane and each of the one or more height adjusting mechanisms is a winding mechanism, the angle of the second reference surface with respect to the horizontal plane is adjusted to a preset angle when the controller performs the adjustment control so that the attitude of the vertically movable member can be corrected. And when the angle sensor detects the angle of the second reference surface with respect to the horizontal plane and each of the one or more height adjusting mechanisms is a position changing mechanism, the angle of the second reference surface with respect to the horizontal plane is adjusted to a preset angle when the controller performs the adjustment control so that the attitude of the vertically movable member can be corrected.

Thus, the angle of the first reference surface or the second reference surface with respect to the horizontal plane is adjusted to the preset angle when the controller performs the adjustment control so that the attitude of the vertically movable member can be corrected. And this operation does not rely on the skill level of the worker; so, the attitude of the support mechanism can be easily corrected to an appropriate attitude.

DETAILED DESCRIPTION OF EMBODIMENTS

Figure 1:
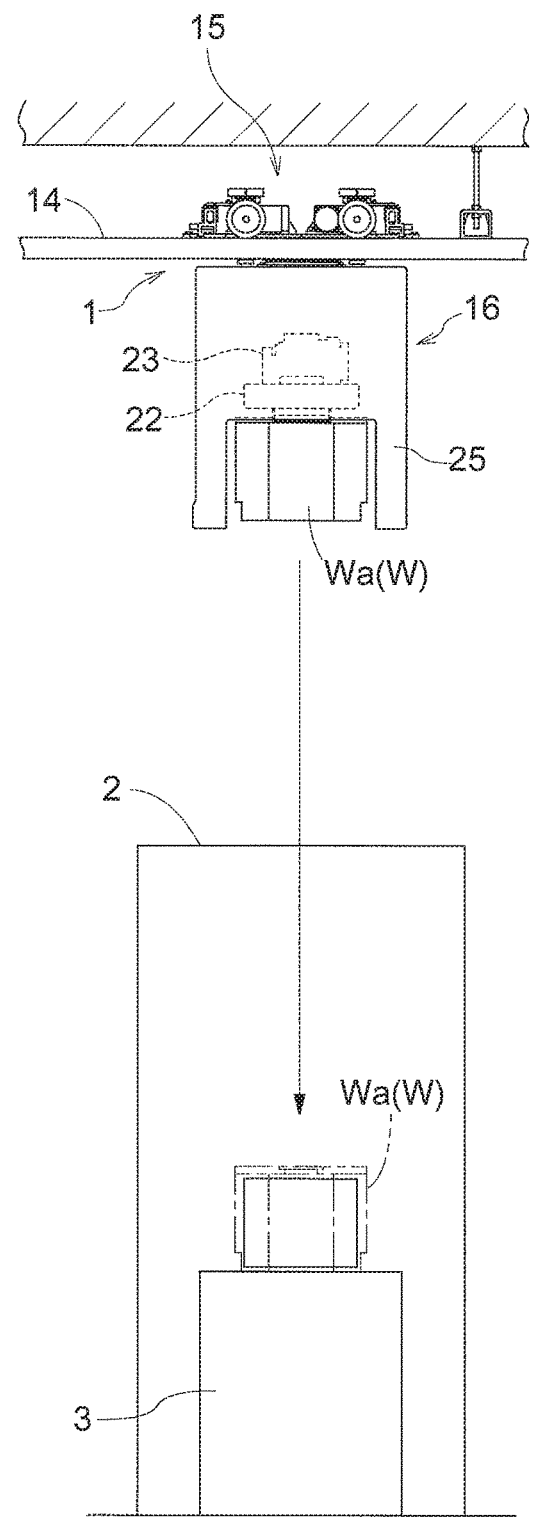
FIG. 1 is a side view of an article transport vehicle which is supporting a transported object.
Figure 2:
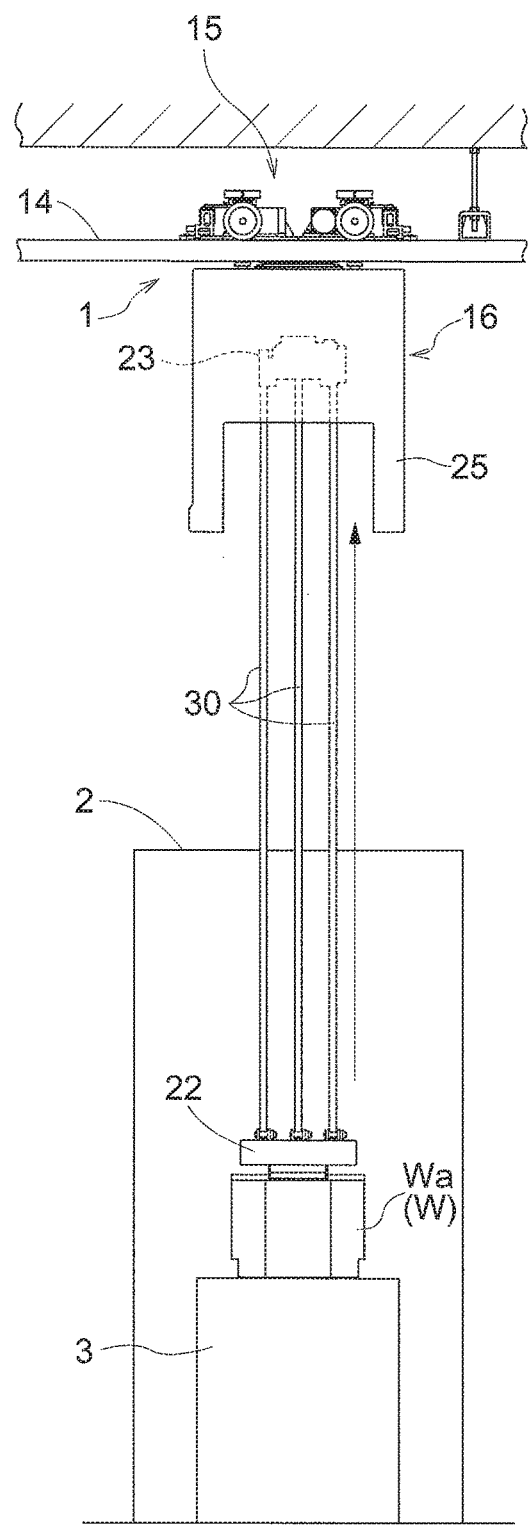
FIG. 2 is also a side view of the article transport vehicle which is supporting the transported object.

Embodiments of an article transport facility in accordance with the present invention are described next with reference to the attached drawings. As shown in FIGS. 1 and 2, an article transport facility include an article transport vehicle 1 configured to travel near a ceiling and along a travel path to transport a container Wa which is a transported object, a processing device 2 for processing substrates held in the container Wa, and a support platform 3 installed on the floor surface and near the processing device 2. Note that, in the present embodiment, a FOUP (Front Opening Unified Pod) for holding semiconductor substrates is used as the container Wa (transported object). In addition, in the following description, the direction along the travel path will be referred to as the travel direction whereas the direction that is perpendicular to the travel direction in plan view will be referred to as the lateral width direction.

Figure 3:
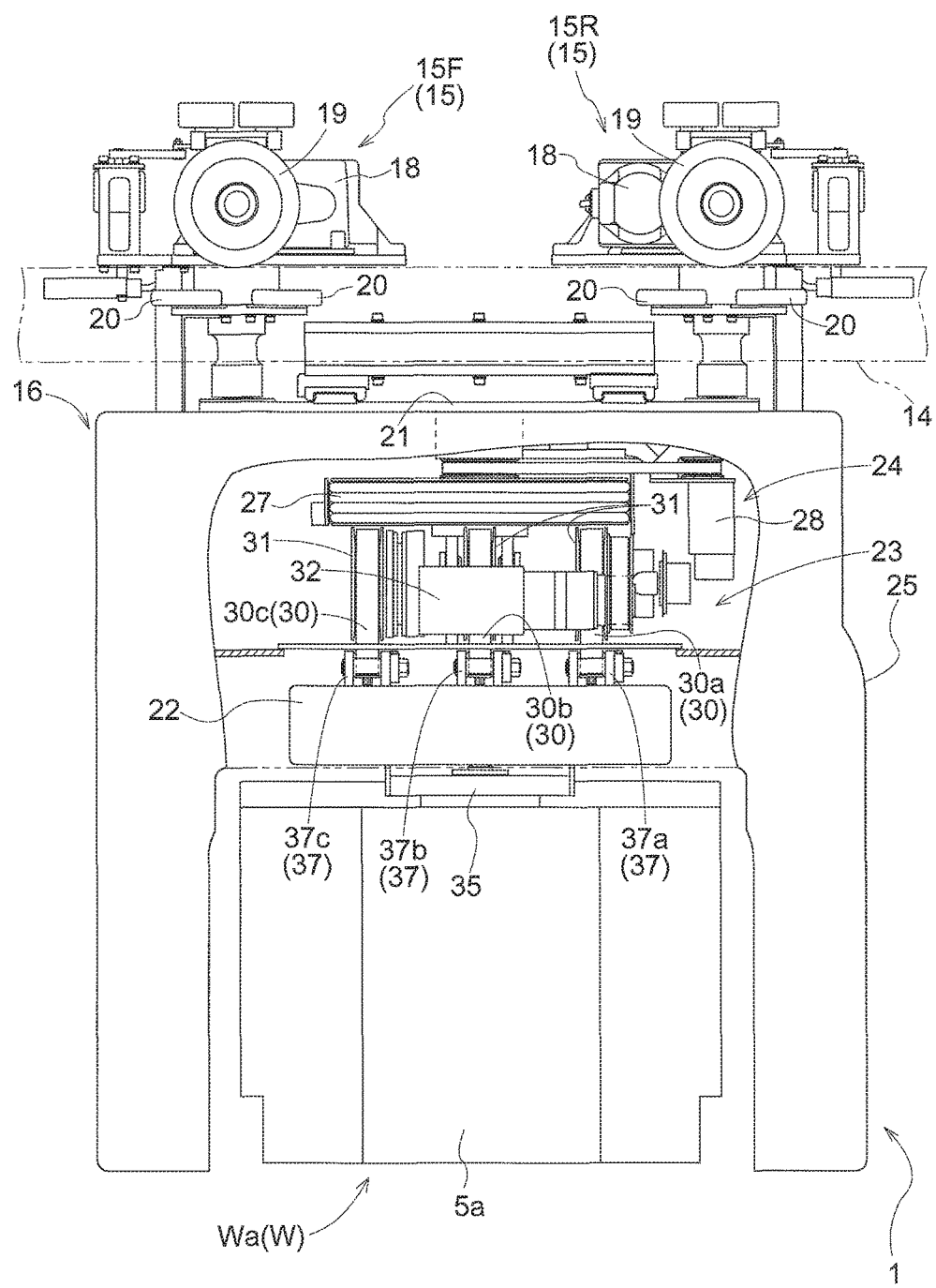
FIG. 3 is a side view of the article transport vehicle with a part of cover member cut out.
Figure 4:
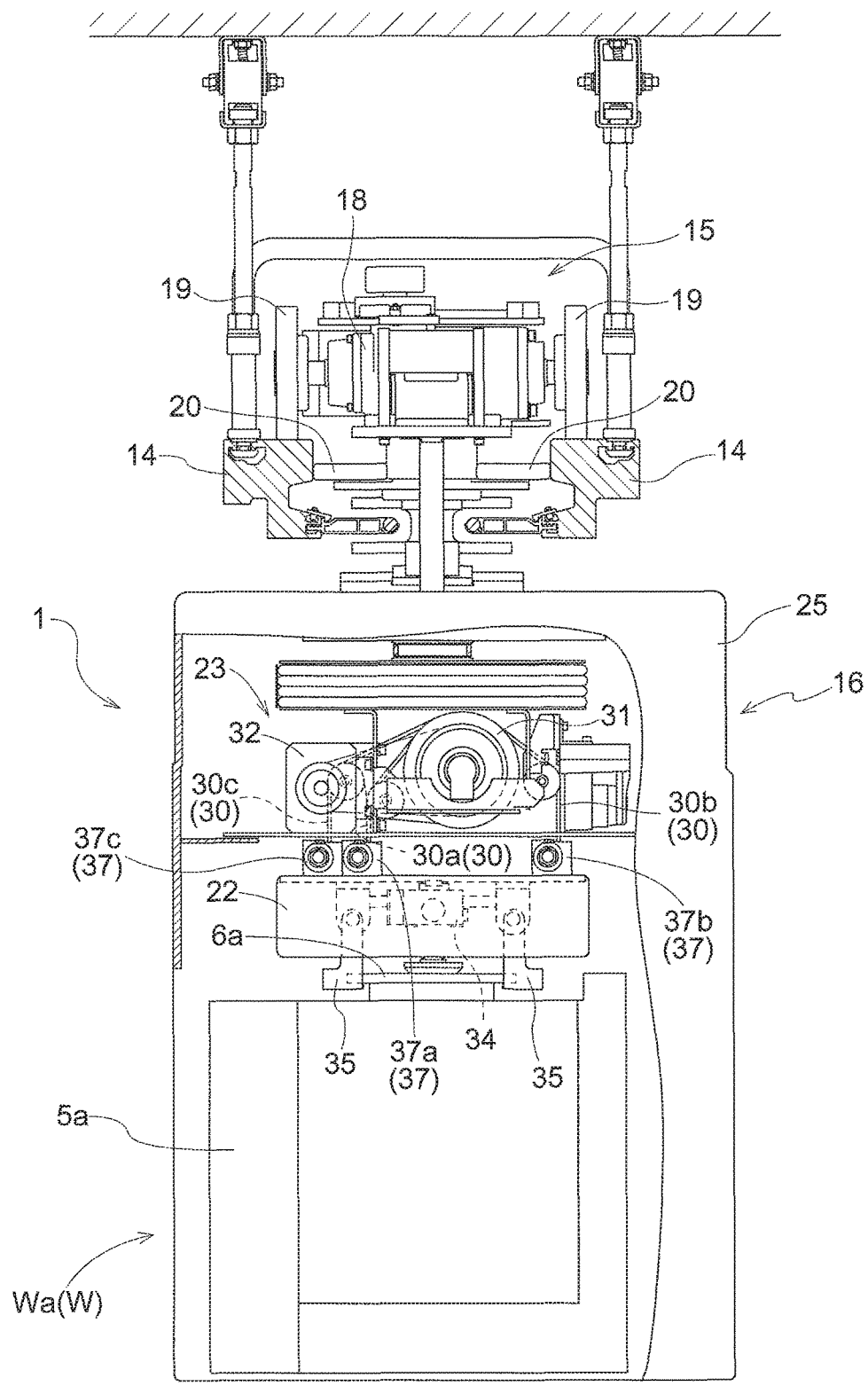
FIG. 4 is a front view of the article transport vehicle with a part of cover member cut out.

As shown in FIGS. 3 and 4, the container Wa has a container flange portion 6a (see FIG. 4) which is provided to the upper end portion of the container Wa and which is configured to be held and supported by the support mechanism 22 of the article transport vehicle 1, a container main body 5a which is located below the container flange portion 6a and which is configured to hold a plurality of semiconductor substrates, and a lid (not shown) which can be detached and attached for closing an opening formed in the front face of the container main body 5a for inserting and retrieving the substrates. The article transport vehicle 1 is configured to transport a container Wa with the container flange portion 6a suspended from and supported by the article transport vehicle 1.

The article transport vehicle 1 is described next. Note that, the article transport vehicle 1 is assumed to be traveling along a horizontal and straight travel path in the following description of the article transport vehicle 1. In addition, in the description, the right and left directions are defined as seen from the back of the article transport vehicle 1 toward the front of the article transport vehicle 1. As shown in FIGS. 2 and 3, the article transport vehicle 1 has travel portions 15 configured to travel on and along a pair of right and left travel rails 14 which are suspended from and supported by the ceiling, and a main body portion 16 which is located below the pair of right and left travel rails 14 and which is configured to support a container Wa.

As shown in FIG. 3, the travel portions 15 consist of the front travel portion 15F and the back travel portion 15R which are spaced apart from each other, or next to each other, along the travel direction. The front travel portion 15F is located in front of the back travel portion 15R. And each of the front travel portion 15F and the back travel portion 15R is connected to the base portion 21 of the main body portion 16 to be rotatable about a vertical axis.

The front travel portion 15F has a pair of right and left travel wheels 19 which are driven and rotated by an electric-powered actuating motor 18 and which travel on respective travel surfaces formed by the top surfaces of the pair of right and left travel rails 14. In addition, the front travel portion 15F is provided with pairs of right and left guide wheels 20 each of which can rotate freely about a corresponding axis extending along a vehicle body vertical direction (i.e., about a vertical axis) such that the guide wheels 20 roll on respective inward surfaces of the pair of right and left travel rails 14. Note that the two pairs of right and left guide wheel 20 are provided to the front travel portion 15F such that one pair is spaced apart from the other pair along the travel direction. As with the front travel portion 15F, one pair of right and left travel wheels 19 and two pairs of right and left guide wheels 20 are provided to the back travel portion 15R.

The article transport vehicle 1 is configured to travel along the travel path as the result of the fact that the travel wheels 19 of the front travel portion 15F and the travel wheels 19 of the back travel portion 15R are driven and rotated while its position along the lateral width direction is restricted as a result of the fact that the guide wheels 20 of the front travel portion 15F and the guide wheels 20 of the back travel portion 15R are guided by the pair of travel rails 14. In addition, the article transport vehicle 1 is configured to be able to travel along the travel path even where the travel path is curved and forms a circular arc, as a result of the fact that each of the front travel portion 15F and the back travel portion 15R can pivot about the corresponding vertical axis with respect to the main body portion 16.

As shown in FIG. 3, the main body portion 16 has a base portion 21 connected to the travel portions 15, a support mechanism 22 which functions as the vertically movable member configured to support an article W, a vertically moving mechanism 23 configured to vertically move the support mechanism 22 with respect to the travel portions 15, a rotating mechanism 24 configured to rotate the support mechanism 22 about a vertical axis with respect to the travel portion 15, and a cover member 25 which covers the upper side and the front and back side along the travel direction of the container Wa supported by the support mechanism 22 in a set raised position (position shown in FIG. 1, etc.).

The rotating mechanism 24 is configured to rotate the support mechanism 22 supported by a rotatable member 27 about a vertical axis by rotating the rotatable member 27 about the vertical axis by the actuating action of an electric motor 28 for rotating (rotating motor for short).

The vertically moving mechanism 23 has a plurality of belt-shaped members 30 each of which has a distal end portion connected to the support mechanism 22 to suspend the support mechanism 22, winding members 31 configured to spool the corresponding belt-shaped member 30, and a motor 32 for causing a vertical motion (vertically moving motor for short) for rotating the winding members 31. The vertically moving mechanism 23 is configured to vertically move the support mechanism 22 by rotating the winding members 31 in forward and reverse directions with the vertically moving motor 32 to selectively spool and feed out the plurality of the belt-shaped members 30. Note that the winding members 31 together with the vertically moving motor 32 are, or correspond to, the first actuator which is supported by the base portion 21 and which is configured to spool and feed out the belt-shaped members 30 to vertically move the support mechanism 22 with respect to the base portion 21. In case a separate vertically moving motor is provided for each winding member 31, the winding members 31 together with the vertically moving motors are, or correspond to, the first actuator. In addition, the plurality of belt-shaped members 30 are, or correspond to, the plurality of elongate flexible members which are connected to the support mechanism 22 to suspend the support mechanism 22. It is preferable that the elongate flexible member is made of a material or has a structure that resists or prevents stretching under tension or includes a reinforcing material (such as steel cords) that resists or prevents stretching under tension. The elongate flexible member may be formed of metal such as steel, rubber, nylon, carbon fiber, or any other known material used in a cord, rope, cable, wire, and the like as well as combination thereof. The belt-shaped member is an example of an elongate flexible member and has a lateral width that is greater than its thickness.

As shown in FIG. 4, the support mechanism 22 is configured to move a pair of gripping claws 35 toward and away from each other by the actuating action of an electric motor 34 for moving the gripping claws 35 (or a gripper motor 34 for short). The support mechanism 22 can be switched to a support state in which the pair of gripping claws 35 support the container flange portion 6a of the container Wa by causing the pair of gripping claws 35 to be moved closer to each other, and can be switched to a support release state in which the supporting of the container flange portion 6a of the container Wa by the pair of gripping claws 35 is released by causing the pair of gripping claws 35 to be moved away from each other. Thus, the support mechanism 22 is configured to be capable of being switched to the support state and to the support release state by the actuating action of the gripper motor 34.

Figure 8:
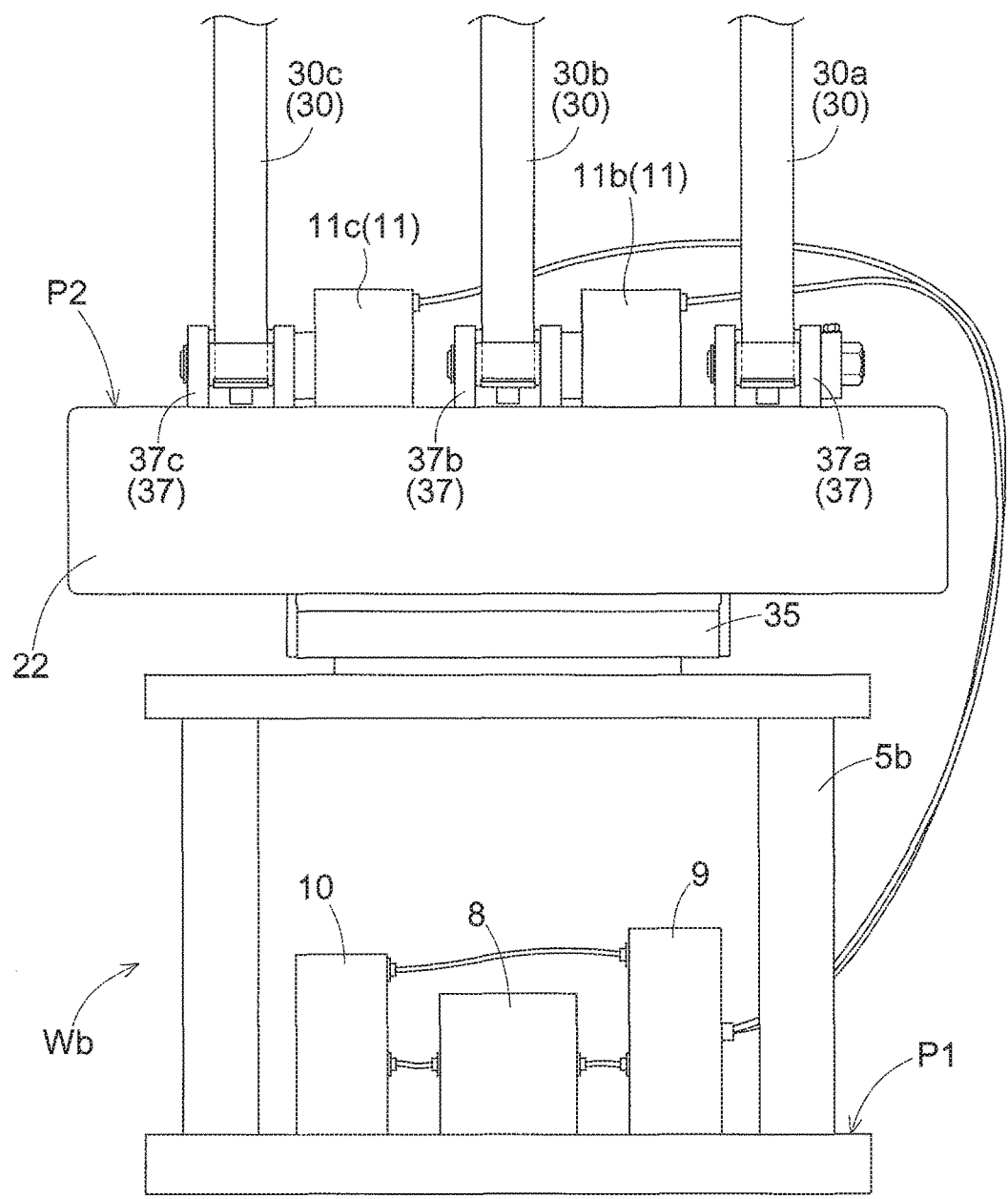
FIG. 8 is a side view of the winding mechanisms and the adjusting device.

As shown in FIGS. 3, 4, and 8, the vertically moving mechanism 23 has three belt-shaped members 30 as the plurality of belt-shaped members 30, namely, a first belt-shaped member 30a, a second belt-shaped member 30b, and a third belt-shaped member 30c. Winding mechanisms 37 are fixed to the support mechanism 22. And the three belt-shaped members 30 are connected to the winding mechanisms 37 and thus, are connected to the support mechanism 22 through the winding mechanisms 37. Note that, the plurality of belt-shaped members 30 are, or correspond to, the plurality of elongate flexible members. The first belt-shaped member 30a is, or corresponds to, a first elongate flexible member. The second belt-shaped member 30a is, or corresponds to, a second elongate flexible member. And the third belt-shaped member 30a is, or corresponds to, a third elongate flexible member.

Figure 5:
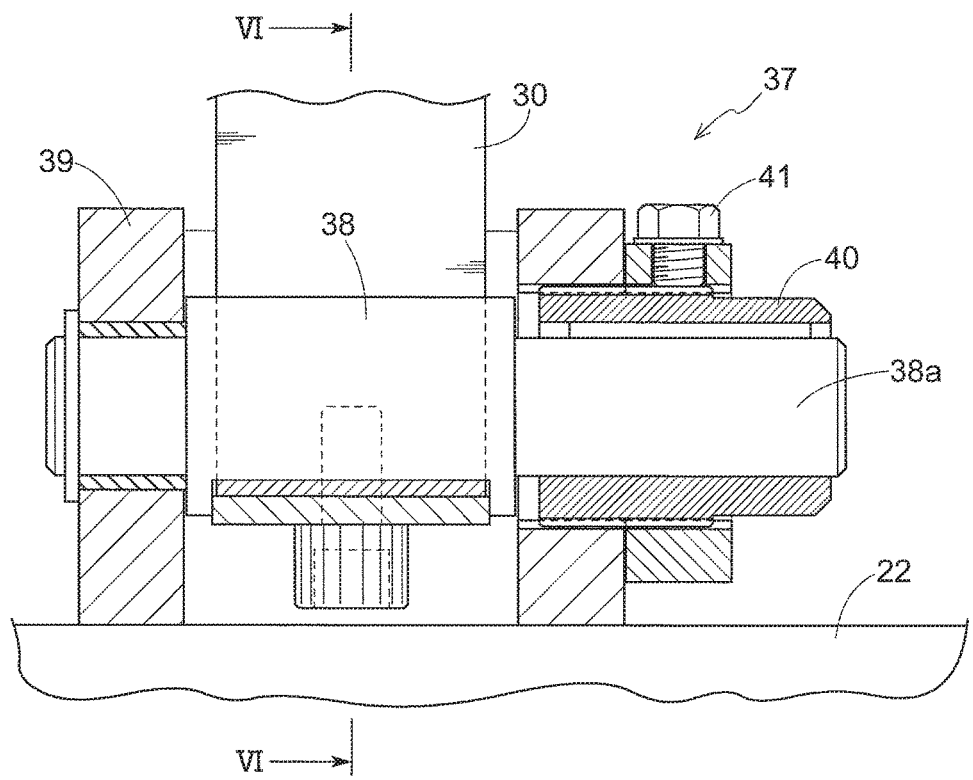
FIG. 5 is a vertical sectional side view of a winding mechanism.
Figure 6:
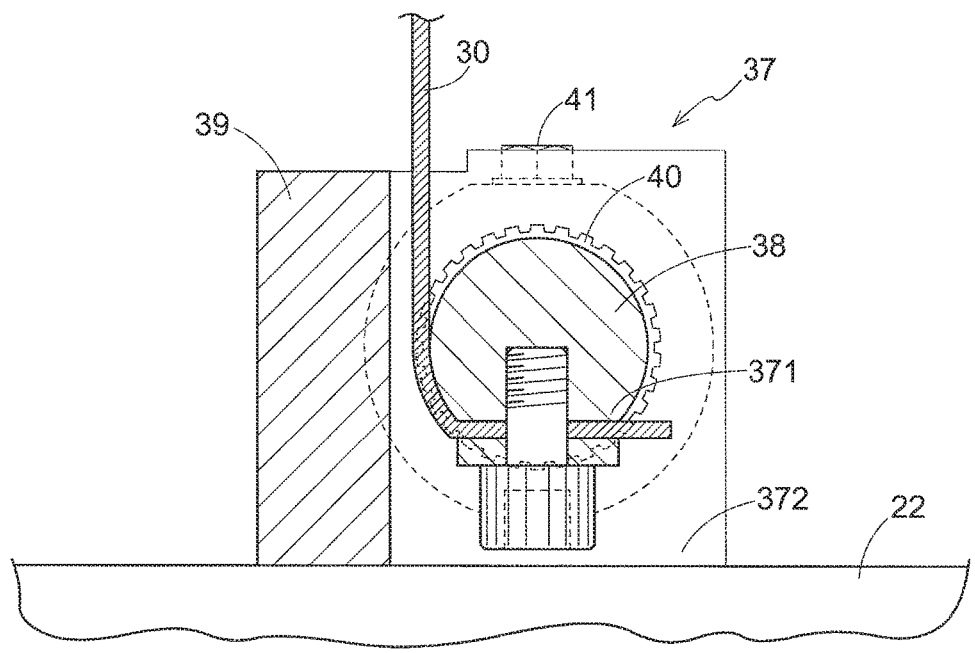
FIG. 6 is a vertical sectional front view of the winding mechanism.

As shown in FIG. 5, each winding mechanism 37 has a winding portion 38 connected to a belt-shaped member 30 for taking up the belt-shaped member 30, a fixed portion 39 which is supported by the winding portion 38 for rotation relative to the winding portion 38 and which is fixed to the support mechanism 22, an operating portion 40 for rotating the winding portion 38 by a worker with a use of an operating mechanism 11 described below with reference to FIG. 8, and a fixing member 41 for holding the operating portion 40 in place. As shown in FIG. 6, each winding mechanism 37 has a first location 37a at which the belt-shaped member 30 is connected to the winding mechanism 37, and a second location 37b at which the winding mechanism 37 is joined to the support mechanism 22. The first location 37a is a location on the winding portion 38 whereas the second location 37b is on the fixed portion 39.

The operating portion 40 is generally formed in a shape of a circular cylinder, and a shank 38a of the winding portion 38 is inserted into the operating portion 40. As shown in FIGS. 5 and 6, splines are formed on the outer surface of the operating portion 40, and on the inner surface of the fixed portion 39. The shank 38a of the winding portion 38 and the operating portion 40 are coupled to each other such that they rotate integrally about an axis and can move relative to each other along the axial direction. And by moving the operating portion 40 along the axial direction, the operating portion 40 can be moved to a position (see FIG. 5) at which at least a part of the operating portion 40 is fit within the fixed portion 39 and a position (not shown) at which the operating portion 40 is moved out of the fixed portion 39 along the axial direction.

As described above, splines are formed on the outer surface of the operating portion 40 and on the inner surface of the fixed portion 39; thus, rotation of the operating portion 40 about the axis is restricted or prevented with the operating portion 40 fit within the fixed portion 39. And the operating portion 40 can be fixed with respect to the fixed portion 39 by the fixing member 41 to prevent the operating portion 40 from moving along the axial direction with the operating portion 40 fit within the fixed portion 39.

On the other hand, when the operating portion 40 is out of the fixed portion 39 along the axial direction, the operating portion 40 can be rotated about the axis. The winding portion 38 can be rotated in forward and reverse directions by rotating the operating portion 40 by a worker or with a use of an operating mechanism 11 described below. The belt-shaped member 30 is selectively taken up onto and fed out of the winding portion 38 by this rotation. Thus, the height of the portion of the support mechanism 22 to which the belt-shaped member 30 is connected can be adjusted by selectively performing the spooling and feeding out of the belt-shaped member 30. By performing such operation or adjustment on at least two of the three belt-shaped members 30, the tilting of the support mechanism 22 and an article W supported by the support mechanism 22 can be adjusted and corrected.

Figure 7:
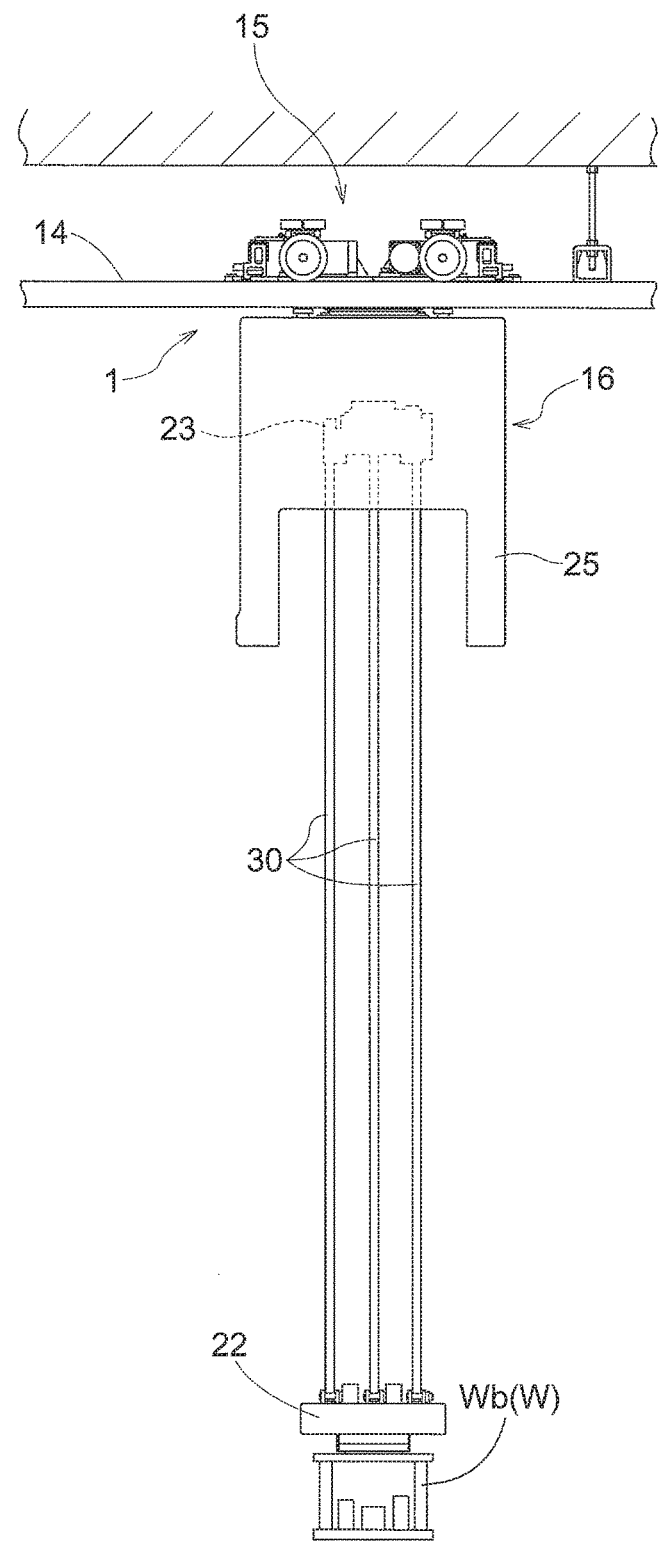
FIG. 7 is a side view of the article transport vehicle when it is supporting an adjusting device.

As shown in FIG. 8, in addition to the article transport vehicle 1 having the base portion 21 and the plurality of belt-shaped members 30, the article transport facility is provided with an angle sensor 8 configured to detect the angle of the first reference surface P1 of an article W supported by the support mechanism 22 with respect to a horizontal plane, operating mechanisms 11 which serve as second actuators configured to actuate the winding mechanisms 37, and a controller 9. The controller 9 includes a CPU and peripheral circuits including a memory circuit and a communication circuit for communicating with various components such as actuators and sensors, and may be a microcomputer, with algorithms in the form of software that is stored and executable by the CPU for performing the required functions disclosed in the present specification. The operating mechanisms 11 and the controller 9 are provided to an adjusting device Wb. When adjusting and correcting the tilting of the article W supported by the support mechanism 22, the adjusting device Wb is supported by the support mechanism 22 as shown in FIG. 7, and the operating mechanisms 11 are connected to the operating portions 40 of the winding mechanisms 37, as shown in FIG. 8.

The first reference surface P1 is a setting surface on which the angle sensor 8 of the adjusting device Wb is installed. In addition, the top surface of the support mechanism 22 serving as the surface to which the winding mechanisms 37 are fixed serves as the second reference surface P2. The first reference surface P1 and the second reference surface P2 are parallel to each other when distortion due to, for example, deterioration that occurs with the passage of time has not occurred in the support mechanism 22 or the adjusting device Wb. In addition, the first reference surface P1 and the second reference surface P2 are horizontal when the travel portions 15 are in a horizontal attitude and the support mechanism 22 is properly supported by the three belt-shaped members 30, etc. Each operating mechanism 11 has an engaging portion for engaging the operating portion 40 (see FIG. 5) of a winding mechanism 37, and an electrical motor for drivingly rotating the engaging portion. The operating mechanisms 11 operate the operating portions 40 to rotate the winding portions 38 and thus to selectively take up and feed out the belt-shaped members 30 by rotating the engaging portions by the actuating action of the electric motors.

The adjusting device Wb is described next. As shown in FIG. 8, the adjusting device Wb has an adjusting device flange portion (not shown) provided to the upper end portion of the adjusting device Wb to be supported by the support mechanism 22 of the article transport vehicle 1 (i.e., for being held or gripped by the gripping claws 35), an adjusting device main body portion 5b which is located below the adjusting device flange portion and which supports its devices for inspection. Provided to the adjusting device main body portion 5b of the adjusting device Wb, as the devices for inspection, are the angle sensor 8, the controller 9, and a battery 10.

The adjusting device Wb is configured to have the same weight as that of a container Wa that is holding the maximum number of substrates that can be held in the container Wa. In addition, the adjusting device flange portion is formed in the same shape as the container flange portion 6a so that it can be supported by the support mechanism 22 (i.e., it can be held or gripped by the gripping claws 35). In other words, the article W to be supported by the support mechanism 22 is either the adjusting device Wb or the container Wa.

Figure 9:
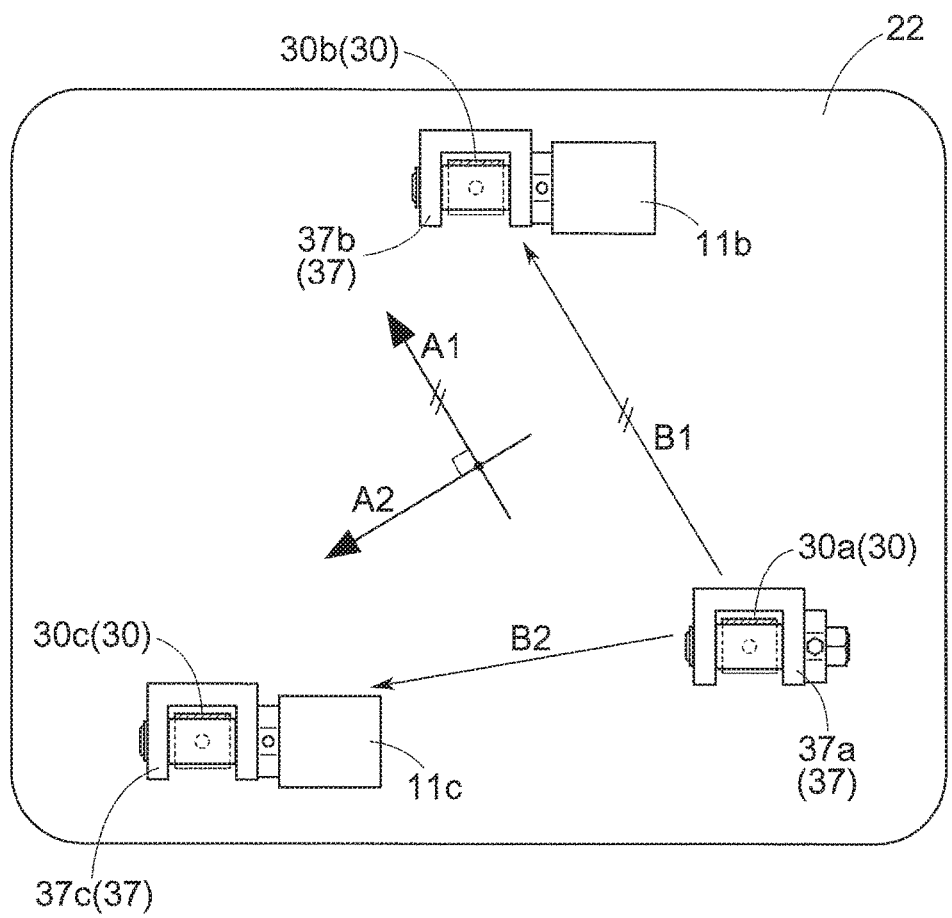
FIG. 9 is a plan view of a support mechanism.

The angle sensor 8 is installed to detect the angle of the first reference surface P1 of the adjusting device Wb with respect to the horizontal plane. More specifically, as shown in FIG. 9, the angle sensor 8 detects the angle of a first detecting direction A1 and the angle of a second detecting direction A2 in the first reference surface P1 with respect to the horizontal plane. Thus, a dual-axis angle sensor 8 for detecting angles of two directions, namely, the first detecting direction A1 and the second detecting direction A2, is used as the angle sensor 8. The second detecting direction A2 is perpendicular to the first detecting direction A1 as seen along the direction perpendicular to the first reference surface P1 (i.e., direction normal to the first reference surface P1 or along the direction of the thickness of the angle sensor 8).

With a first winding mechanism 37a being defined to be the winding mechanism 37 to which the first belt-shaped member 30a is connected, a second winding mechanism 37b being defined to be the winding mechanism 37 to which the second belt-shaped member 30b is connected, and a third winding mechanism 37c being defined to be the winding mechanism 37 to which the third belt-shaped member 30c is connected, the operating mechanisms 11 are connected to the second winding mechanism 37b and the third winding mechanism 37c (see FIGS. 8 and 9) when adjusting and correcting the angle of the adjusting device Wb with the adjusting device Wb supported by the support mechanism 22. Among the three belt-shaped members 30, the elongate flexible members (namely, the second belt-shaped member 30b and the third belt-shaped member 30c) that excludes one belt-shaped member 30 (namely, the first belt-shaped member 30a) are designated to be the elongate flexible members to be adjusted (referred to as "target elongate flexible members") by the winding mechanisms 37.

In the following description, the operating mechanism 11 that is connected to the second winding mechanism 37b will be referred to as a second operating mechanism 11b, and the operating mechanism 11 that is connected to the third winding mechanism 37c will be referred to as a third operating mechanism 11c. Note that the second operating mechanism 11b is, or corresponds to, the second adjusting actuator configured to actuate a second height adjusting mechanism, whereas the third operating mechanism 11c is, or corresponds to, the third adjusting actuator configured to actuate a third height adjusting mechanism. In addition, as shown in FIG. 9, as seen along the direction normal to the first reference surface P1, the direction in which the second belt-shaped member 30b exists, or located, with respect to the first belt-shaped member 30a (the direction from the first belt-shaped member 30a toward the second belt-shaped member 30b) will be referred to a first presence direction B1 whereas the direction in which the third belt-shaped member 30b exists, or is located, with respect to the first belt-shaped member 30a (the direction from the first belt-shaped member 30a toward the third belt-shaped member 30b) will be referred to a second presence direction B1.

The angle sensor 8 is located such that the direction of the thickness of the angle sensor 8 is perpendicular to the first reference surface P1. In addition, the angle sensor 8 is located such that, as shown in FIG. 9, the first detecting direction A1 coincides with the first presence direction B1 and the second detecting direction A2 is a direction that is perpendicular to the first detecting direction A1, when the first reference surface P1 and the second reference surface P2 are both horizontal, as seen along the direction perpendicular to the first reference surface P1 (i.e., direction normal to the first reference surface P1 or along the direction of the thickness of the angle sensor 8). The angle sensor 8 is configured to detect a first angle which is an angle of the first reference surface P1 along the first detecting direction A1 (which is, or corresponds to, the first presence direction B1 and the first direction) in the first reference surface P1 with respect to the horizontal plane and a second angle which is an angle of the first reference surface P1 along the second detecting direction A2 (which is, or corresponds to, the second direction, and a direction perpendicular to the first presence direction B1) in the first reference surface P1 with respect to the horizontal plane.

The controller 9 performs an adjustment control for controlling the operating mechanisms 11 based on the information detected by the angle sensor 8 (detection information) to adjust the angle of the first reference surface P1 with respect to the horizontal plane to a preset angle. In the adjustment control, the second adjusting actuator is controlled based on the first angle detected by the angle sensor 8, and subsequently, the third adjusting actuator is controlled based on the first angle and second angle which are detected by the angle sensor 8. Incidentally, the preset angle is set to be zero degree with respect to the horizontal plane.

Note that, stored in the controller 9 as adjustment information, before performing the adjustment control, are the amount of actuation of the second operating mechanism 11b that corresponds to the first angle detected by the angle sensor 8 (required amount of spooling or feeding out of the second belt-shaped member 30b), and the amount of actuation of the third operating mechanism 11b that corresponds to the second angle detected by the angle sensor 8 (required amount of spooling or feeding out of the third belt-shaped member 30c).

In the adjustment control, firstly, the second operating mechanism 11b is controlled based on the first angle detected by the angle sensor 8 and the adjustment information stored in the controller 9 such that the angle of the first detecting direction A1 in the first reference surface P1 with respect to the horizontal plane becomes equal to the preset angle. By controlling the second operating mechanism 11b in manner, the support mechanism 22 is pivoted about a line segment that is in the first reference surface P1 and that extends along the second presence direction B2, until the first angle coincides with the preset angle.

Next, in the adjustment control, the third operating mechanism 11c is controlled based on the second angle detected by the angle sensor 8 and the adjustment information stored in the controller 9 such that the angle of the second detecting direction A2 in the first reference surface P1 with respect to the horizontal plane becomes equal to the preset angle. By controlling the third operating mechanism 11c in manner, the support mechanism 22 is pivoted about a line segment that is in the first reference surface P1 and that extends along the first presence direction B1, until the second angle coincides with the preset angle. By controller 9 performing the adjustment control in this manner, the angle of the first reference surface P1 with respect to the horizontal plane is adjusted to the preset angle, and thus, the angle of an article W supported by the support mechanism 22 can be corrected.

[Other Embodiments]

Other embodiments are described next. Note that any arrangement or feature of any one of the embodiments described below does not have to be used by itself but can be used in combination with an arrangement or a feature of any other embodiment unless such a combination or combinations give rise to a contradiction.

(1) In the description above, each height adjusting mechanism is a winding mechanism configured to take up and feed out an elongate flexible member. However, each height adjusting mechanism may be a position changing mechanism configured to change a relative positional relation along the vertical direction between a target elongate flexible member and the support mechanism or the base portion.

Figure 10:
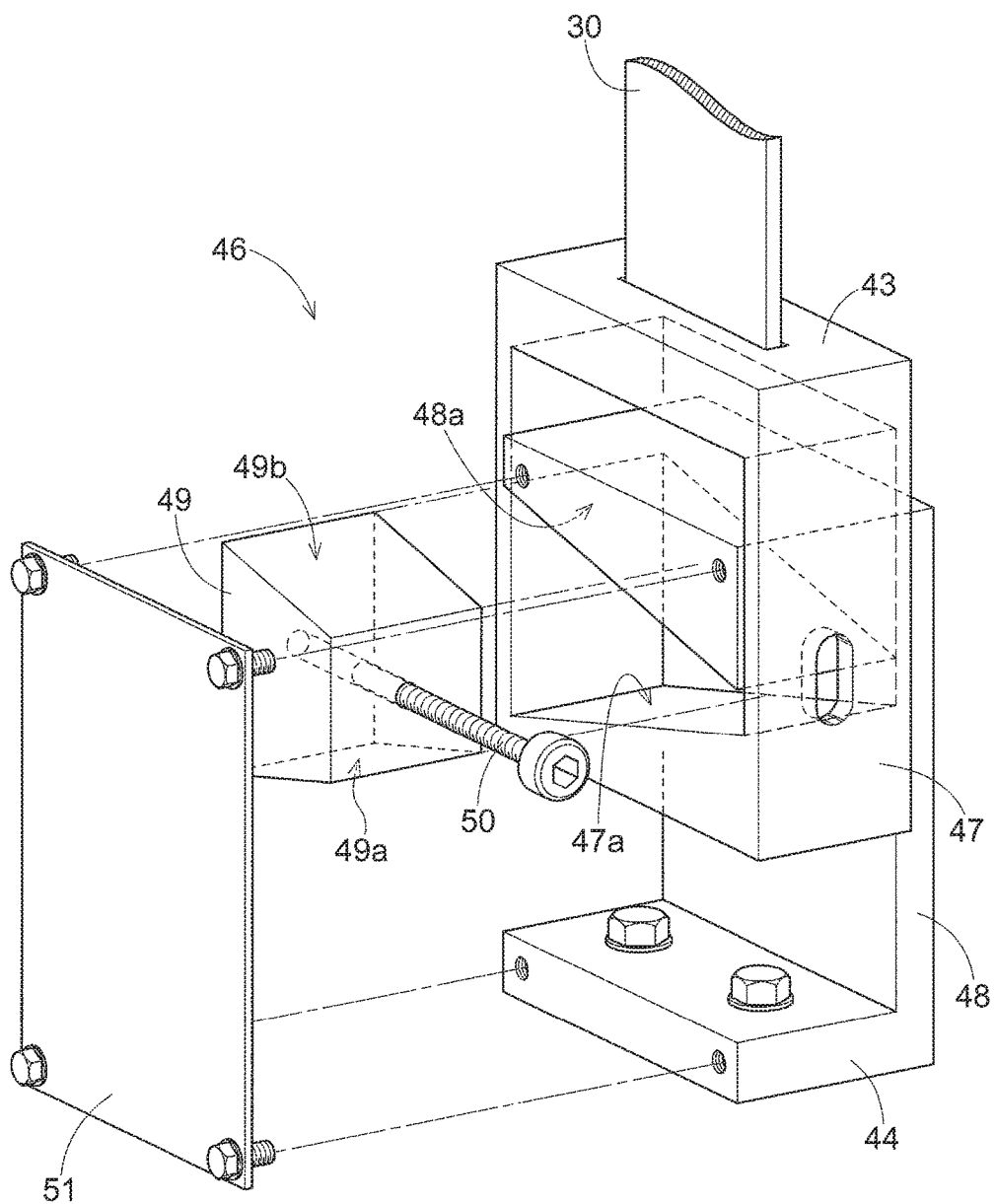
FIG. 10 is an exploded perspective view of a position changing mechanism.
Figure 11:
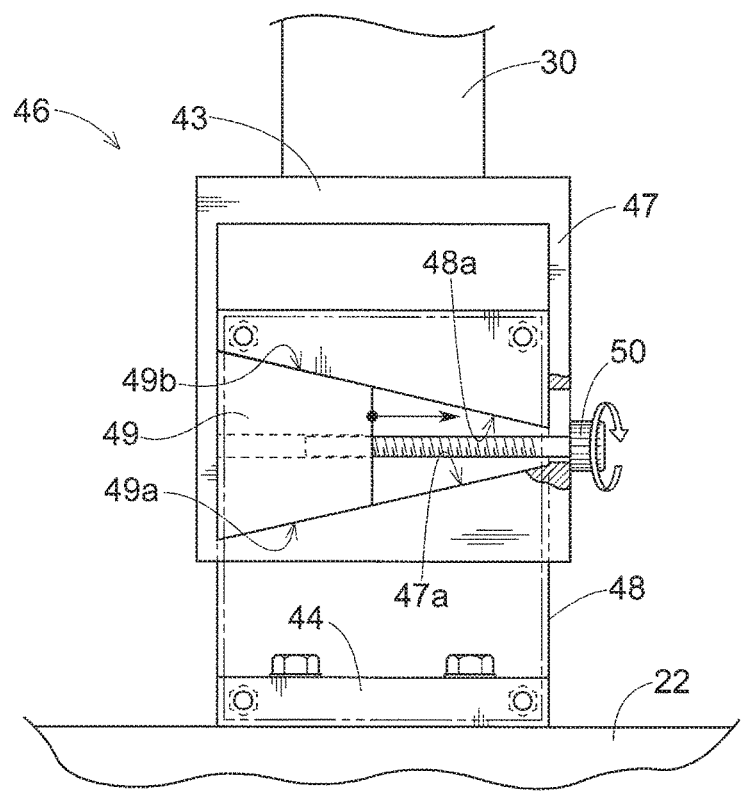
FIG. 11 is a side view of the position changing mechanism.
Figure 12:
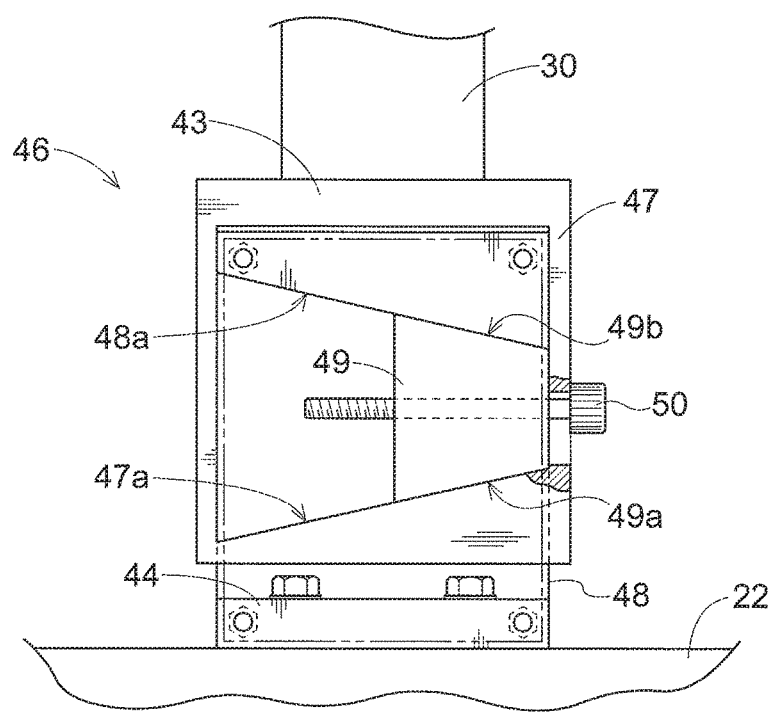
FIG. 12 is a side view of the position changing mechanism.

In such a case, it would be preferable that the position changing mechanism 46 has a structure such as that of an example shown in FIGS. 10-12. More specifically, each position changing mechanism 46 has a first member 47 connected to a belt-shaped member 30, a second member 48 connected to the support mechanism 22, a third member 49 located between the first member 47 and the second member 48 along the vertical direction, and an operating member 50 for moving the third member 49 along a moving direction which is along a horizontal direction. The third member 49 is configured to be moved along the moving direction along the horizontal direction by the actuating action of the operating mechanism 11. In addition, the third member 49 has a downward-facing first surface 49a and an upward-facing second surface 49b. The first surface 49a is formed to be a sloped surface which is higher toward one end (right hand side end in FIG. 11) along the moving direction whereas the second surface 49b is formed to be a sloped surface which is lower toward the one end along the moving direction. Therefore, the third member 49 is formed in such a shape that the vertical distance between the first surface 49a and the second surface 49b gradually narrows or decreases toward the one end along the moving direction.

The first member 47 has a third surface 47a in contact with the first surface 49a for a relative sliding motion. And this third surface 47a is formed to be a sloped surface which is higher toward one end along the moving direction. The second member 48 has a fourth surface 48a in contact with the second surface 49b for a relative sliding motion. And this fourth surface 48a is formed to be a sloped surface which is lower toward one end along the moving direction. Note that the third surface 47a may be a curved or convex surface that projects upward and the fourth surface 48a may be a curved or convex surface that projects downward.

With the position changing mechanism 46 configured as described above, the third member 49 which meshes with the operating member 50 is moved along the moving direction as operating member 50 is rotated by the actuating action of the operating mechanism 11. And this movement of the third member 49 causes the first member 47 and the second member 48 to be moved toward, or away from, each other depending on the direction of the movement of the third member 49. This changes the relative positional relation along the vertical direction between the first location 43 in the first member 47 at which the belt-shaped member 30 is connected and the second location 44 in the second member 48 at which the second member 48 is connected to the support mechanism 22. Note that the restricting member 51 (see FIG. 10) is a member fixed to the second member 48 so as to be located at a lateral side of the first member 47, and is a member for preventing the first member 47 from moving horizontally with respect to the second member 48.

(2) In the description above, an example embodiment is described in which the adjusting device has the same weight as that of a container that is holding the maximum number of substrates that can be held in the container. However, the adjusting device may have, for example, the same weight as that of a container that is holding no substrates. Alternatively, the adjusting device may have the same weight as that of a container that is holding half the maximum number of substrates that can be held in the container. Thus, the state, thus the weight, of the container which the adjusting device has the same weight as may be changed as appropriate. Note that the weight of the adjusting device may include the weight of the operating mechanisms.

(3) In the description above, an example embodiment is described in which information or signals between the controller and the operating mechanisms are transmitted and received through electric wires. However, one or more wireless communication devices may be provided so that information or signals between the controller and the operating mechanisms can be transmitted and received wirelessly.

(4) In the description above, an example embodiment is described in which a dual-axis angle sensor 8 for detecting angles along two directions, namely, the first detecting direction A1 and the second detecting direction A2, is used as the angle sensor 8. However, for example, two single-axis angle sensors 8 each for detecting the angle along one direction, with one sensor 8 for the first detecting direction A1 and the other for the second detecting direction A2, may be provided. Thus the kind and the number of the angle sensors may be changed as appropriate. In the description above, an example embodiment is described in which the angle of the first detecting direction A1 and the angle of the second detecting direction A2 are detected by the angle sensor; however, the angle sensor may be used to detect an angle of one or two directions that are different from one or both of these angles.

(5) In the description above, an example embodiment is described in which three elongate flexible members are provided as the plurality of elongate flexible members; however, two or four or more elongate flexible members may be provided as the plurality of elongate flexible members.

(6) In the description above, an example embodiment is described in which the upper end portions of the elongate flexible members are connected to the respective winding members of the first actuator and in which the winding members are concerned to the base portion and the lower end portions of the elongate flexible members are connected to the vertically movable member. However, the lower end portions of the elongate flexible members may be connected to respective winding members of the first actuator instead. And the winding members may be connected to the vertically movable member and the upper end portions of the elongate flexible members may be connected to the base portion. Also, in the description above, an example embodiment is described in which the height adjusting mechanisms are provided between the elongate flexible members and the vertically movable member. However, the height adjusting mechanisms may be provided between the elongate flexible members and the base portion. Note that when the winding members are connected to the base portion and the winding mechanisms that function as the height adjusting mechanisms are provided between the elongate flexible members and the base portion, or when the winding members are connected to the vertically movable member and the winding mechanisms that function as the height adjusting mechanisms are provided between the elongate flexible members and the vertically movable member, then the winding members may also be used as the winding portions, and the vertically moving motor may be used as the second actuator.

(7) In the description above, an example embodiment is described in which the adjusting device is provided with the angle sensor, and in which the angles of the first reference surface with respect to the horizontal plane are detected by the angle sensor with the adjusting device supported by the vertically movable member. However, the angle sensor may be installed on the top surface (second reference surface) of the support mechanism to detect the angles of the second reference surface with respect to the horizontal plane with the angle sensor. In such a case, the controller controls, in the adjustment control, the operating mechanisms based on the information detected by the angle sensor to adjust the angles of the second reference surface with respect to the horizontal plane to a preset angle.

(8) In the description above, an example embodiment is described in which the required amount of actuation of the second operating mechanism and the required amount of actuation of the third operating mechanism are stored in the controller as the adjustment information and in which the controller, in the adjustment control, controls the second adjusting actuator and the third adjusting actuator based on the detected information from the angle sensor and the required amounts of actuation from the adjustment information. However, the control of the second adjusting actuator and the third adjusting actuator in adjustment control may be changed as appropriate. More specifically, for example, the controller may store, as position information, information on the separation distance between the second elongate flexible member and the first elongate flexible member along the first presence direction and angle information of the first presence direction, as well as information on the separation distance between the third elongate flexible member and the first elongate flexible member along the second presence direction and angle information of the second presence direction. And the controller, in the adjustment control, may calculate the required amount of actuation of the second adjusting actuator and the required amount of actuation of the second adjusting actuator based on the detected information from the angle sensor and the position information, and may control the second adjusting actuator and the third adjusting actuator based on the required amounts of actuation.

(9) In the description above, each elongate flexible member is a belt-shaped member; however, the elongate flexible member may be other types of such member, such as a cord, wire, string, cable, etc. Note that a cord may be defined to be a long slender flexible material. Based on this definition, a belt-shaped member may be an example of a cord. In the description above, the vertically movable member is configured to suspend and support an article; however, the vertically movable member may have a configuration different from this and may be configured to support an article on top of the vertically movable member.

[Summary of Embodiments Described Above]

The article transport facility described above is briefly summarized next.

In one embodiment, the article transport facility comprises: a base portion; a vertically movable member configured to support an article; a plurality of elongate flexible members connected to the vertically movable member to suspend the vertically movable member; a first actuator configured to selectively spool and feed out the plurality of elongate flexible members to vertically move the vertically movable member with respect to the base portion; an angle sensor configured to detect one of an angle of a first reference surface of the article supported by the vertically movable member with respect to a horizontal plane and an angle of a second reference surface of the vertically movable member with respect to a horizontal plane; one or more height adjusting mechanisms; one or more second actuators configured to actuate the one or more height adjusting mechanisms; and a controller; wherein, with one or more of the plurality of elongate flexible members that excludes one of the plurality of elongate flexible members being specified as one or more target elongate flexible members, each of the one or more height adjusting mechanisms is one of (a) a winding mechanism configured to selectively take up and feed out a corresponding one of the one or more target elongate flexible members, and (b) a position changing mechanism configured to change a relative positional relation, along a vertical direction, between a corresponding target elongate flexible member and the vertically movable member or the base portion; and wherein the controller performs an adjustment control for controlling the one or more second actuators based on detected information from the angle sensor to adjust the one of an angle of the first reference surface with respect to a horizontal plane and an angle of the second reference surface with respect to a horizontal plane, to a preset angle.

With this arrangement, by installing the angle sensor on, for example, the first reference surface of the article, the angle of the first reference surface with respect to the horizontal plane can be detected by the angle sensor. Alternatively, by installing the angle sensor on, for example, the second reference surface of the article, the angle of the first reference surface with respect to the horizontal plane can be detected by the angle sensor.

And when the angle sensor detects the angle of the first reference surface with respect to the horizontal plane and each of the one or more height adjusting mechanisms is a winding mechanism, then the one or more winding mechanisms are operated by the actuating action of the one or more second actuators when the controller performs the adjustment control so that the one or more target elongate flexible members (elongate flexible members to be adjusted) are selectively taken up or fed out. This allows the angle of the first reference surface with respect to the horizontal plane to be adjusted to a preset angle and the attitude of the vertically movable member to be corrected, so that the tilting of the article supported by the vertically movable member is alleviated.

And, when the angle sensor detects the angle of the first reference surface with respect to the horizontal plane and each of the one or more height adjusting mechanisms is a position changing mechanism, then, the one or more position changing mechanisms are operated by the actuating action of the one or more second actuators when the controller performs the adjustment control so that the relative positional relation between a target elongate flexible member and the vertically movable member or the base portion along the vertical direction is changed and so that the angle of the first reference surface with respect to the horizontal plane is adjusted to a preset angle. This allows the attitude of the vertically movable member to be corrected so that the tilting of the article supported by the vertically movable member can be alleviated.

Similarly, when the angle sensor detects the angle of the second reference surface with respect to the horizontal plane and each of the one or more height adjusting mechanisms is a winding mechanism, the angle of the second reference surface with respect to the horizontal plane is adjusted to a preset angle when the controller performs the adjustment control so that the attitude of the vertically movable member can be corrected. And when the angle sensor detects the angle of the second reference surface with respect to the horizontal plane and each of the one or more height adjusting mechanisms is a position changing mechanism, the angle of the second reference surface with respect to the horizontal plane is adjusted to a preset angle when the controller performs the adjustment control so that the attitude of the vertically movable member can be corrected.

Thus, the angle of the first reference surface or the second reference surface with respect to the horizontal plane is adjusted to the preset angle when the controller performs the adjustment control so that the attitude of the vertically movable member can be corrected. And this operation does not rely on the skill level of the worker; so, the attitude of the support mechanism can be easily corrected to an appropriate attitude.

Here, the article is preferably either an adjusting device or a transported object, wherein the angle sensor and the controller are preferably provided to the adjusting device; and wherein the angle sensor is preferably configured to detect an angle of the first reference surface of the adjusting device with respect to a horizontal plane.

With the arrangement described above, since the angle sensor detects the angle of the first reference surface with respect to a horizontal plane, the angle of the first reference surface with respect to the horizontal plane is adjusted to the preset angle when the controller performs the adjustment control. In other words, because the sensor detects the tilting of the adjusting device itself that is supported by the vertically movable member instead of detecting the tilting of the vertically movable member, the attitude of the adjusting device itself that is supported by the vertically movable member can be corrected. And because the attitude of the adjusting device itself that is supported by the vertically movable member is corrected, the adjusting device can be supported in a proper attitude even when the vertically movable member itself is deformed in some way; therefore, when a transported object is supported by the vertically movable member, the tilting of the transported object can be alleviated.

In addition, the adjusting device preferably has a same weight as the transported object.

With the arrangement described above, the angle of the vertically movable member can be measured under the same or similar condition as when a transported object is supported by the vertically movable member; thus, the tilting of a transported object when it is supported by vertically movable member can be alleviated properly.

In addition, each winding mechanism preferably has a winding portion connected to a corresponding target elongate flexible member for taking up the corresponding target elongate flexible member, and wherein each of the one or more second actuators is preferably configured to rotate a corresponding winding portion to selectively take up and feed out the corresponding target elongate flexible member.

With the arrangement described above, by rotating a winding portion in a forward direction and a reverse direction with the corresponding second actuator, the corresponding target elongate flexible member can be selectively taken up and fed out. And since the winding mechanism can take up the corresponding target flexible member onto the winding portion and feed out the corresponding target flexible member from the winding portion, the winding mechanism can be made compact along the vertical direction even when a long length of the target flexible member needs to be taken up and fed out.

In addition, the position changing mechanism preferably includes a first member connected to a corresponding one of the plurality of elongate flexible members, a second member connected to one of the vertically movable member and the base portion, and a third member located between the first member and the second member along the vertical direction, wherein the third member is preferably configured to be moved along a moving direction along a horizontal direction by an actuating action of a corresponding one of the one or more second actuators, and preferably has a downward-facing first surface and an upward-facing second surface, and is preferably formed in such a shape that a vertical distance between the first surface and the second surface gradually narrows toward one end thereof along the moving direction, wherein the first member preferably has an upward-facing third surface in contact with the first surface for a relative sliding motion, wherein the second member preferably has a downward-facing fourth surface in contact with the second surface for a relative sliding motion, and wherein each of the one or more of second actuators is preferably configured to move a corresponding third member along the moving direction.

With the arrangement described above, by moving the third member in one direction along the moving direction by means of the second actuator, the first member is moved downward relative to the second member and thus, a target elongate flexible member is moved downward with respect to the vertically movable member or the base portion. And by moving the third member in the opposite direction along the moving direction by means of the second actuator, the first member is moved upward relative to the second member and thus, the target elongate flexible member is moved upward with respect to the vertically movable member or the base portion.

Thus, by moving the third member along the moving direction by means of the second actuator, the relative positional relation between a target elongate flexible member and the vertically movable member or the base portion along the vertical direction can be changed. And by forming the first member, the second member, and the third member with a material that undergoes a dimensional change along the vertical direction due to changes that occur with the passage of time to a lesser degree than the elongate flexible members, the angle of the vertically movable member can be corrected properly more easily compared to when the elongate flexible members are taken up and fed out to adjust and correct the attitude of the vertically movable member.

In addition, the plurality of elongate flexible members preferably include at least a first elongate flexible member, a second elongate flexible member, and a third elongate flexible member, wherein the second elongate flexible member and the third elongate flexible member are preferably the one or more target elongate flexible members, wherein the one or more second actuators includes a second adjusting actuator that is configured to actuate one of the one or more height adjusting mechanisms to which the second elongate flexible member is connected and a third adjusting actuator that is configured to actuate one of the one or more height adjusting mechanisms to which the third elongate flexible member is connected and wherein, with a first direction being defined to be a direction in which the second elongate flexible member exists with respect to the first elongate flexible member as seen along a direction normal to one of the first reference surface and the second reference surface, and with a second direction being defined to be a direction perpendicular to the first direction as seen along a direction normal to one of the first reference surface and the second reference surface, the angle sensor is preferably configured to detect a first angle which is an angle of one of the first reference surface and the second reference surface along the first direction with respect to a horizontal plane and a second angle which is an angle of one of the first reference surface and the second reference surface along the second direction with respect to a horizontal plane, and wherein, in the adjustment control, the second adjusting actuator is preferably controlled based on the first angle detected by the angle sensor, and subsequently the third adjusting actuator is preferably controlled based on the first angle and the second angle detected by the angle sensor.

With the arrangement described above, in the adjustment control, the second adjusting actuator is controlled based on the first angle detected by angle sensor so that the first angle becomes equal to the preset angle. Therefore, for example, the height of the portion of the vertically movable member that is supported by the first elongate flexible member can be made equal to the height of the portion of the vertically movable member that is supported by the second elongate flexible member.

And the third adjusting actuator is controlled based on the second angle detected by angle sensor so that the second angle becomes equal to the preset angle. When this happens, the vertically movable member is pivoted about a horizontal line segment that extends in a direction in which the second elongate flexible member exists, or is located, with respect to the first elongate flexible member. Therefore, without having to change the first angle, the height of the portion of the vertically movable member that is supported by the third elongate flexible member, for example, can be made equal to the height of the portions of the vertically movable member that are supported by the first and the second elongate flexible members.

Thus, the tilting in the first direction can be corrected by controlling the second adjusting actuator based only on the first angle. And the tilting in the second direction can be corrected by controlling the third adjusting actuator based only on the second angle. Therefore, the tilting of the first reference surface or the second reference surface in both the first direction and the second direction with respect to the horizontal plane can be corrected by a simple control

What is claimed is:

1. An article transport facility comprising:
   a base portion;
   gripping claws configured to support an article;
   a plurality of elongate flexible belts connected to the gripping claws to suspend the gripping claws;
   a first actuator configured to selectively spool and feed out the plurality of elongate flexible belts to vertically move the gripping claws with respect to the base portion;
   an angle sensor configured to detect one of an angle of a first reference surface of the article supported by the gripping claws with respect to a horizontal plane and an angle of a second reference surface of the gripping claws with respect to a horizontal plane;
   one or more height adjusting mechanisms;
   one or more second actuators configured to actuate the one or more height adjusting mechanisms; and
   a controller;
   wherein, with one or more of the plurality of elongate flexible belts that excludes one of the plurality of elongate flexible belts being specified as one or more target elongate flexible belts, each of the one or more height adjusting mechanisms is one of (a) a winding mechanism configured to selectively take up and feed out a corresponding one of the one or more target elongate flexible belts, and (b) a position changing mechanism configured to change a relative positional relation, along a vertical direction, between a corresponding target elongate flexible belt and the gripping claws or the base portion,
   wherein the controller performs an adjustment control for controlling the one or more second actuators based on detected information from the angle sensor to adjust the one of an angle of the first reference surface with respect to a horizontal plane and an angle of the second reference surface with respect to a horizontal plane, to a preset angle, wherein each winding mechanism has a toothed shaft connected to a corresponding target elongate flexible belt for taking up the corresponding target elongate flexible belt, wherein each of the one or more second actuators is configured to rotate a corresponding toothed shaft to selectively take up and feed out the corresponding target elongate flexible belt, wherein the position changing mechanism includes a first member connected to a corresponding one of the plurality of elongate flexible belts, a second member connected to one of the base portion and the gripping claws, and a third member located between the first member and the second member along the vertical direction, wherein the third member is configured to be moved along a moving direction along a horizontal direction by an actuating action of a corresponding one of the one or more second actuators, and has a downward-facing first surface and an upward-facing second surface, and is formed in such a shape that a vertical distance between the first surface and the second surface gradually narrows toward one end thereof along the moving direction, wherein the first member has an upward-facing third surface in contact with the first surface for a relative sliding motion, wherein the second member has a downward-facing fourth surface in contact with the second surface for a relative sliding motion, and wherein each of the one or more of the second actuators is configured to move a corresponding third member along the moving direction.

2. The article transport facility as defined in claim 1, wherein the article is either an adjusting device comprising a flange portion and a main body portion or a transported object, wherein the angle sensor and the controller are provided to the adjusting device, and wherein the angle sensor is configured to detect an angle of the first reference surface of the adjusting device with respect to a horizontal plane.

3. The article transport facility as defined in claim 2, wherein the adjusting device has a same weight as the transported object.

4. The article transport facility as defined in claim 3, wherein the plurality of elongate flexible belts includes at least a first elongate flexible belt, a second elongate flexible belt, and a third elongate flexible belt, wherein the second elongate flexible belt and the third elongate flexible belt are the one or more target elongate flexible belts, wherein the one or more second actuators includes a second adjusting actuator that is configured to actuate one of the one or more height adjusting mechanisms to which the second elongate flexible belt is connected and a third adjusting actuator that is configured to actuate one of the one or more height adjusting mechanisms to which the third elongate flexible belt is connected, wherein, with a first direction being defined to be a direction in which the second elongate flexible belt exists with respect to the first elongate flexible belt as seen along a direction normal to one of the first reference surface and the second reference surface, and with a second direction being defined to be a direction perpendicular to the first direction as seen along a direction normal to one of the first reference surface and the second reference surface, the angle sensor is configured to detect a first angle which is an angle of one of the first reference surface and the second reference surface along the first direction with respect to a horizontal plane and a second angle which is an angle of one of the first reference surface and the second reference surface along the second direction with respect to a horizontal plane, and wherein, in the adjustment control, the second adjusting actuator is controlled based on the first angle detected by the angle sensor, and subsequently the third adjusting actuator is controlled based on the first angle and the second angle detected by the angle sensor.

5. The article transport facility as defined in claim 2, wherein the plurality of elongate flexible belts includes at least a first elongate flexible belt, a second elongate flexible belt, and a third elongate flexible belt, wherein the second elongate flexible belt and the third elongate flexible belt are the one or more target elongate flexible belts, wherein the one or more second actuators includes a second adjusting actuator that is configured to actuate one of the one or more height adjusting mechanisms to which the second elongate flexible belt is connected and a third adjusting actuator that is configured to actuate one of the one or more height adjusting mechanisms to which the third elongate flexible belt is connected, wherein, with a first direction being defined to be a direction in which the second elongate flexible belt exists with respect to the first elongate flexible belt as seen along a direction normal to one of the first reference surface and the second reference surface, and with a second direction being defined to be a direction perpendicular to the first direction as seen along a direction normal to one of the first reference surface and the second reference surface, the angle sensor is configured to detect a first angle which is an angle of one of the first reference surface and the second reference surface along the first direction with respect to a horizontal plane and a second angle which is an angle of one of the first reference surface and the second reference surface along the second direction with respect to a horizontal plane, and wherein, in the adjustment control, the second adjusting actuator is controlled based on the first angle detected by the angle sensor, and subsequently the third adjusting actuator is controlled based on the first angle and the second angle detected by the angle sensor.

6. The article transport facility as defined in claim 1, wherein the plurality of elongate flexible belts includes at least a first elongate flexible belt, a second elongate flexible belt, and a third elongate flexible belt, wherein the second elongate flexible belt and the third elongate flexible belt are the one or more target elongate flexible belts, wherein the one or more second actuators includes a second adjusting actuator that is configured to actuate one of the one or more height adjusting mechanisms to which the second elongate flexible belt is connected and a third adjusting actuator that is configured to actuate one of the one or more height adjusting mechanisms to which the third elongate flexible belt is connected, wherein, with a first direction being defined to be a direction in which the second elongate flexible belt exists with respect to the first elongate flexible belt as seen along a direction normal to one of the first reference surface and the second reference surface, and with a second direction being defined to be a direction perpendicular to the first direction as seen along a direction normal to one of the first reference surface and the second reference surface, the angle sensor is configured to detect a first angle which is an angle of one of the first reference surface and the second reference surface along the first direction with respect to a horizontal plane and a second angle which is an angle of one of the first reference surface and the second reference surface along the second direction with respect to a horizontal plane, and wherein, in the adjustment control, the second adjusting actuator is controlled based on the first angle detected by the angle sensor, and subsequently the third adjusting actuator is controlled based on the first angle and the second angle detected by the angle sensor.

* * * * *